(12) United States Patent
Liu

(10) Patent No.: US 11,670,538 B2
(45) Date of Patent: Jun. 6, 2023

(54) METHOD FOR MANUFACTURING LOGIC DEVICE ISOLATION IN EMBEDDED STORAGE PROCESS

(71) Applicant: Hua Hong Semiconductor (Wuxi) Limited, Wuxi (CN)

(72) Inventor: Junwen Liu, Wuxi (CN)

(73) Assignee: Hua Hong Semiconductor (Wuxi) Limited, Wuxi (CN)

( * ) Notice: Subject to any disclaimer, the term of this patent is extended or adjusted under 35 U.S.C. 154(b) by 0 days.

(21) Appl. No.: 17/529,871

(22) Filed: Nov. 18, 2021

(65) Prior Publication Data
US 2022/0189819 A1 Jun. 16, 2022

(30) Foreign Application Priority Data

Dec. 14, 2020 (CN) .......................... 202011462727.3

(51) Int. Cl.
*H01L 21/762* (2006.01)
*H01L 29/66* (2006.01)
(52) U.S. Cl.
CPC .. *H01L 21/76205* (2013.01); *H01L 29/66825* (2013.01)
(58) Field of Classification Search
CPC ............ H01L 21/762; H01L 21/76224; H01L 21/76227; H01L 21/30621; H01L 21/31055; H01L 21/31116; H01L 21/31138; H01L 21/31144; H01L 21/67069; H01L 21/32136; H01L 21/32135; H01L 21/0214; H01L 21/30604; H01L 21/30608; H01L 21/30617; H01L 21/32134; H01L 21/67075

See application file for complete search history.

(56) References Cited

U.S. PATENT DOCUMENTS 6,080,637 A * 6/2000 Huang .............. H01L 21/76224
438/296
6,214,696 B1 * 4/2001 Wu ................... H01L 21/76232
257/E21.549

FOREIGN PATENT DOCUMENTS

CN 104134628 A 11/2014
CN 111341653 A 6/2020

OTHER PUBLICATIONS

Search report issued in corresponding CN Application No. 2020114627273, dated Jul. 23, 2022, pp. 1-2.

* cited by examiner

*Primary Examiner* — Julio J Maldonado
*Assistant Examiner* — Stanetta D Isaac
(74) *Attorney, Agent, or Firm* — Murtha Cullina LLP

(57) ABSTRACT

A method for manufacturing logic device isolation in an embedded storage process, removing the pad silicon nitride and floating gate polysilicon layer in a shallow trench isolation area and retaining the floating gate oxide layer; depositing acid etching silicon nitride; removing the acid etching silicon nitride at the bottom of the shallow trench isolation and a portion of the silicon substrate adjacent to and under the shallow trench isolation, to form a trench and retain the acid etching silicon nitride on a side of the floating gate polysilicon layer close to the shallow trench isolation; remove the acid etching silicon nitride on the side of the floating gate polysilicon layer close to the shallow trench isolation.

7 Claims, 4 Drawing Sheets

METHOD FOR MANUFACTURING LOGIC DEVICE ISOLATION IN EMBEDDED STORAGE PROCESS

CROSS-REFERENCES TO RELATED APPLICATIONS

This application claims the priority to Chinese patent application No. CN202011462727.3, filed on Dec. 14, 2020 and entitled "METHOD FOR MANUFACTURING LOGIC DEVICE ISOLATION IN EMBEDDED STORAGE PROCESS", the disclosure of which is incorporated herein by reference in its entirety.

TECHNICAL FIELD

The present application relates to semiconductor manufacturing technologies. In particular, the present application relates to a method for manufacturing logic device isolation in an embedded storage process.

BACKGROUND

With the advancement of intelligence in various aspects and the development of the Internet of Things, the application and demand of microprocessors (MCUs) expand continuously. The embedded storage process is the first choice for MCUs. Furthermore, it is expected to make full use of various intellectual property cores (IPs) in the existing logic technology, to save the period of re-development and verification. Therefore, it is necessary to that the characteristic of a logic device in the embedded storage process is consistent with that in the original logic process. The isolation process of a device directly affects the performance of a narrow channel device and plays a very important role in maintaining the consistency of the device characteristic.

Referring to FIG. 1, FIG. 2, FIG. 3, and FIG. 4, the formation of a logic device isolation module in a logic process includes the following steps:

(1) Pad silicon dioxide is generated on a silicon wafer 1, and a silicon nitride layer is deposited on the pad silicon dioxide.

(2) Shallow trench isolation (STI) lithography and etching are performed.

(3) Lateral SiN pull-back of the shallow trench isolation (STI) is performed.

(4) Silicon oxide filling and chemical mechanical polishing (CMP) of the shallow trench isolation (STI) are performed.

Referring to FIG. 5, FIG. 6, and FIG. 7, the formation of an isolation module in a common storage process includes the following steps:

(1) A floating gate oxide layer is generated on a silicon wafer 1, a gate polysilicon layer is generated on the floating gate oxide layer, and pad silicon nitride ($Si_3N_4$) is deposited on the gate polysilicon layer.

(2) Shallow trench isolation (STI) lithography and etching are performed.

(3) Silicon oxide filling and chemical mechanical polishing (CMP) of the shallow trench isolation (STI) are performed.

SUMMARY

A technical problem to be solved by the present application is to provide a method for manufacturing logic device isolation in an embedded storage process, to ensure that a logic device formed in the embedded storage process maintains the same characteristic as that of a logic device formed in a logic process.

In order to solve the above technical problem, the method for manufacturing logic device isolation in an embedded storage process comprises the following steps: step 1. generating a floating gate oxide layer 2 on a silicon substrate 1, generating a floating gate polysilicon layer 3 on the floating gate oxide layer 2, and depositing pad silicon nitride 41 on the floating gate polysilicon layer 3; step 2. performing shallow trench isolation lithography; step 3. performing vertical dry etching to remove the pad silicon nitride 41 and floating gate polysilicon layer 3 in a shallow trench isolation area and retain the floating gate oxide layer 2; step 4. depositing acid etching silicon nitride 42; step 5. performing vertical dry etching to remove the acid etching silicon nitride 42 at the bottom of the shallow trench isolation and a portion of the silicon substrate adjacent to and under the shallow trench isolation, to form a trench 5 and retain the acid etching silicon nitride 42 on a side of the floating gate polysilicon layer 3 close to the shallow trench isolation; step 6. performing lateral SiN pull-back of the shallow trench isolation to remove the acid etching silicon nitride 42 on the side of the floating gate polysilicon layer 3 close to the shallow trench isolation; step 7. performing silicon oxide filling of the shallow trench isolation; and step 8. performing chemical mechanical polishing to form logic device isolation.

In some examples, in step 3, the width of the trench isolation area is 800 Å to 1500 Å; and the opening width of the trench 5 formed in step 5 is 750 Å to 1450 Å.

In some examples, the thickness of the floating gate oxide layer 2 is 70 Å to 150 Å.

In some examples, the thickness of the pad silicon nitride 41 is 600 Å to 1500 Å.

In some examples, the thickness of the acid etching silicon nitride 42 is 50 Å to 200 Å.

In some examples, a mixed solution of hydrofluoric acid and ethylene glycol is used for the SiN pull-back.

In some examples, a hot phosphoric acid solution is used for the SiN pull-back.

The method for manufacturing logic device isolation in an embedded storage process provided by the present application can ensure that a logic device formed in the embedded storage process maintains the same characteristic as that of a logic device formed in a logic process.

BRIEF DESCRIPTION OF THE DRAWINGS

In order to explain the technical solution of the present application more clearly, the drawings required by the present application are briefly described below. Obviously, the drawings in the following description are merely some embodiments of the present application. For those of ordinary skill in the art, other drawings can be obtained on the basis of these drawings without any inventive skill.

Figure 1:
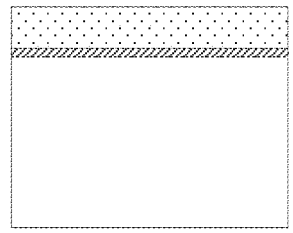
FIGS. 1-4 are schematic diagrams of the prior art formation of a logic device isolation module in a logic process.
Figure 2:
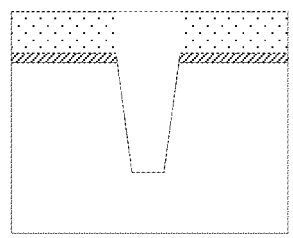
Figure 3:
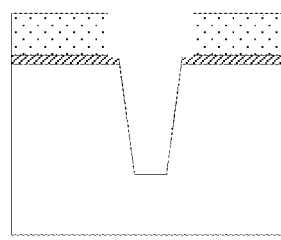
Figure 4:
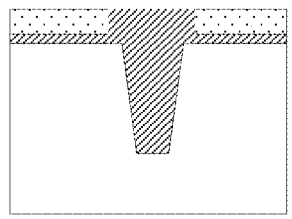
Figure 5:
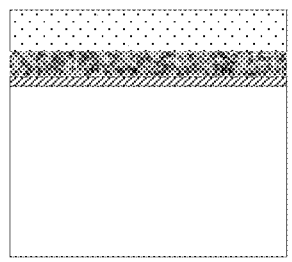
FIGS. 5-7 are schematic diagrams of the prior art formation of an isolation module in a common storage process.
Figure 6:
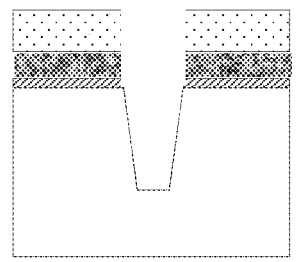
Figure 7:
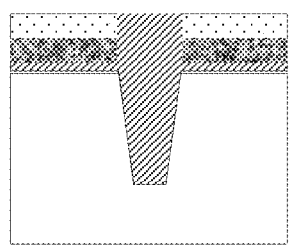

DESCRIPTION OF REFERENCE SIGNS IN THE DRAWINGS 1. silicon substrate; 2. floating gate oxide layer; 3. floating gate polysilicon layer; 41. pad silicon nitride; 42. acid etching silicon nitride; 5. trench.

DETAILED DESCRIPTION OF THE DISCLOSURE

The technical solutions of the present application are clearly and completely described below with reference to the drawings. The described embodiments are merely some of the embodiments of the present application, rather than all of the embodiments. On the basis of the embodiments of the present application, all other embodiments obtained by those of ordinary skill in the art without any inventive skill shall fall within the protection scope of the present application.

Embodiment 1

Figure 8:
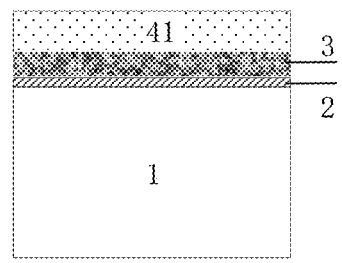
FIGS. 8-12 are schematic diagrams of the formation of an isolation module in a method for manufacturing device isolation in an embedded storage process according to the present application.

Referring to FIGS. 8-12, a method for manufacturing logic device isolation in an embedded storage process includes the following steps:

Step 1. Referring to FIG. 8, a floating gate oxide layer 2 is generated on a silicon substrate 1, a floating gate polysilicon layer 3 is generated on the floating gate oxide layer 2, and pad silicon nitride ($Si_3N_4$) (PAD SiN) 41 is deposited on the floating gate polysilicon layer 3.

Step 2. Shallow trench isolation lithography is performed.

Figure 9:
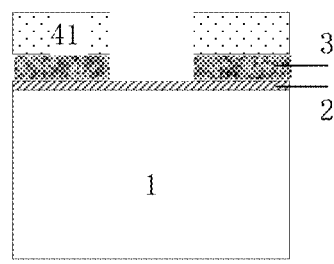

Step 3. Referring to FIG. 9, vertical dry etching is performed to remove the pad silicon nitride 41 and floating gate polysilicon layer 3 in a shallow trench isolation area and retain the floating gate oxide layer 2.

Figure 10:
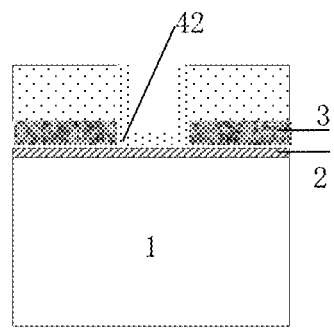

Step 4. Referring to FIG. 10, acid etching silicon nitride 42 is deposited.

Figure 11:
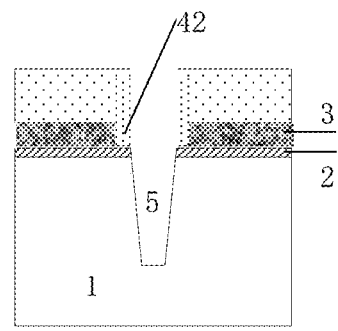

Step 5. Referring to FIG. 11, vertical dry etching is performed to remove the acid etching silicon nitride 42 at the bottom of the shallow trench isolation and a portion of the silicon substrate adjacent to and under the shallow trench isolation, to form a trench 5 and retain the acid etching silicon nitride 42 on a side of the floating gate polysilicon layer 3 close to the shallow trench isolation.

Step 6. Lateral SiN pull-back of the shallow trench isolation is performed to remove the acid etching silicon nitride 42 on the side of the floating gate polysilicon layer 3 close to the shallow trench isolation.

Step 7. Silicon oxide filling of the shallow trench isolation is performed.

Figure 12:
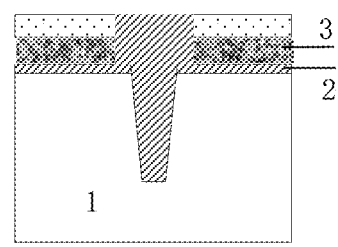

Step 8. Referring to FIG. 12, chemical mechanical polishing (CMP) to form logic device isolation is performed.

The method for manufacturing logic device isolation in an embedded storage process in embodiment 1 can ensure that a logic device formed in the embedded storage process maintains the same characteristic as that of a logic device formed in a logic process.

Embodiment 2

On the basis of the method for manufacturing logic device isolation in an embedded storage process in embodiment 1, in step 3, the width of the trench isolation area is 800 Å to 1500 Å.

The opening width of the trench 5 formed in step 5 is 750 Å to 1450 Å.

In some examples, the thickness of the floating gate oxide layer 2 is 70 Å to 150 Å.

In some examples, the thickness of the pad silicon nitride 41 is 600 Å to 1500 Å.

In some examples, the thickness of the acid etching silicon nitride 42 is 50 Å to 200 Å.

In some examples, a mixed solution of hydrofluoric acid and ethylene glycol is used for the SiN pull-back.

In some examples, a hot phosphoric acid solution is used for the SiN pull-back.

Only some of the embodiments of the present application are described above, and they are not intended to limit the present application. Any modification, equivalent replacement, improvement, etc. made within the spirit and principle of the present application shall be included in the scope of protection of the present scope of protection.

What is claimed is:

1. A method for manufacturing logic device isolation in an embedded storage process, comprising the following steps:
   step 1. generating a floating gate oxide layer on a silicon substrate, generating a floating gate polysilicon layer on the floating gate oxide layer, and depositing pad silicon nitride on the floating gate polysilicon layer;
   step 2. performing shallow trench isolation lithography;
   step 3. performing vertical dry etching to remove the pad silicon nitride and floating gate polysilicon layer in a shallow trench isolation area and retain the floating gate oxide layer;
   step 4. depositing acid etching silicon nitride;
   step 5. performing vertical dry etching to remove the acid etching silicon nitride at the bottom of the shallow trench isolation and a portion of the silicon substrate adjacent to and under the shallow trench isolation, to form a trench and retain the acid etching silicon nitride on a side of the floating gate polysilicon layer close to the shallow trench isolation;
   step 6. performing lateral SiN pull-back of the shallow trench isolation to remove the acid etching silicon nitride on the side of the floating gate polysilicon layer close to the shallow trench isolation;
   step 7. performing silicon oxide filling of the shallow trench isolation; and
   step 8. performing chemical mechanical polishing to form logic device isolation.

2. The method for manufacturing logic device isolation in an embedded storage process according to claim 1, wherein:
   in step 3, the width of the trench isolation area is 800 Å to 1500 Å; and
   the opening width of the trench formed in step 5 is 750 Å to 1450 Å.

3. The method for manufacturing logic device isolation in an embedded storage process according to claim 1, wherein:
   the thickness of the floating gate oxide layer is 70 Å to 150 Å.

4. The method for manufacturing logic device isolation in an embedded storage process according to claim 1, wherein:
   the thickness of the pad silicon nitride is 600 Å to 1500 Å.

5. The method for manufacturing logic device isolation in an embedded storage process according to claim 1, wherein:
   the thickness of the acid etching silicon nitride is 50 Å to 200 Å.

6. The method for manufacturing logic device isolation in an embedded storage process according to claim 1, wherein:
   a mixed solution of hydrofluoric acid and ethylene glycol is used for the SiN pull-back.

7. The method for manufacturing logic device isolation in an embedded storage process according to claim 1, wherein:

a hot phosphoric acid solution is used for the SiN pullback.

* * * * *